United States Patent [19]
Rosenthal et al.

[11] Patent Number: 4,605,907
[45] Date of Patent: Aug. 12, 1986

[54] PRECISELY ADJUSTABLE VOLTAGE CONTROLLED CURRENT MIRROR AMPLIFIER

[75] Inventors: Bruce D. Rosenthal, Sunnyvale; Richard L. Gray, Palo Alto, both of Calif.

[73] Assignee: Teledyne Industries, Inc., Mountain View, Calif.

[21] Appl. No.: 735,652

[22] Filed: May 20, 1985

[51] Int. Cl.[4] .............................................. H03F 3/45
[52] U.S. Cl. ..................................... 330/257; 330/288
[58] Field of Search ................... 330/257, 288, 9, 253; 323/215, 216

[56] References Cited

FOREIGN PATENT DOCUMENTS 213510 12/1983 Japan ................................... 330/253

Primary Examiner—Gene Wan
Attorney, Agent, or Firm—Fliesler, Dubb, Meyer & Lovejoy

[57] ABSTRACT

An adjustable current mirror, responsive to a single polarity balance control signal that may be derived using feedback, is described. The current mirror amplifier comprises first means for providing a first current path, the first means including reference transistor means for providing a current level control signal, issued relative to a reference potential, that corresponds to the current level of the first current path, second means for providing a second current path, the second means including current control transistor means for controlling the current level of the second current path, the current control transistor means being responsive to the current level control signal, and adjust transistor means, provided in series with the reference transistor means in the first current path, for adjusting the current level control signal by effectively modifying the reference potential, seen by the first means, in response to the balance control signal. The current balance between the first and second conduction paths may be directly modified by the resulting effective adjustment of the transconductance of the transistor means in the first conduction path with minimal addition of circuit components and a corresponding minimal impact on nominal current mirror amplifier circuit operation.

26 Claims, 3 Drawing Figures

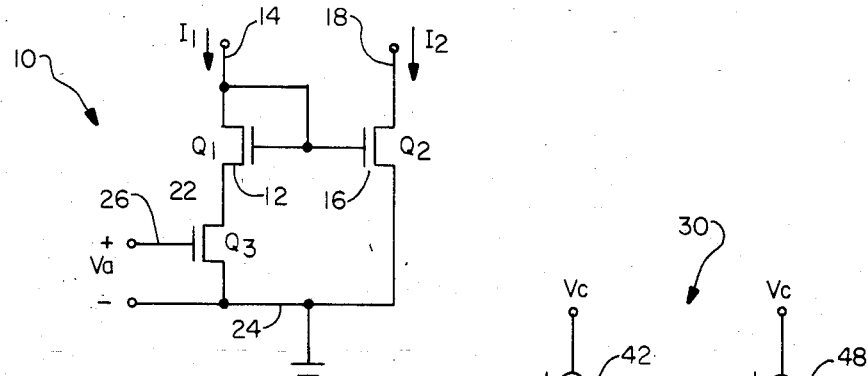
FIG.—1
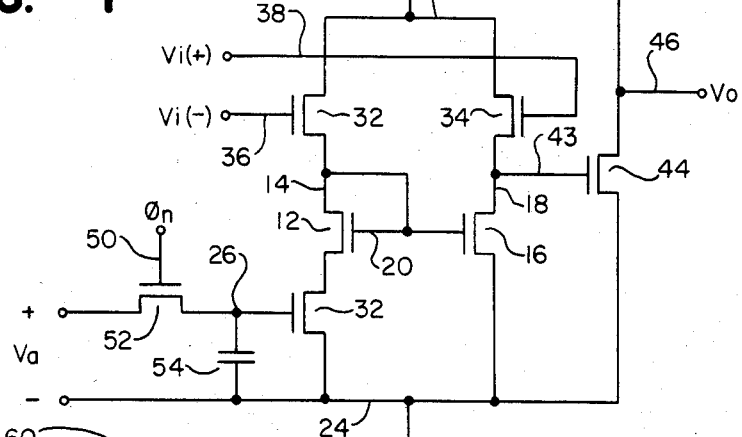
FIG.—2
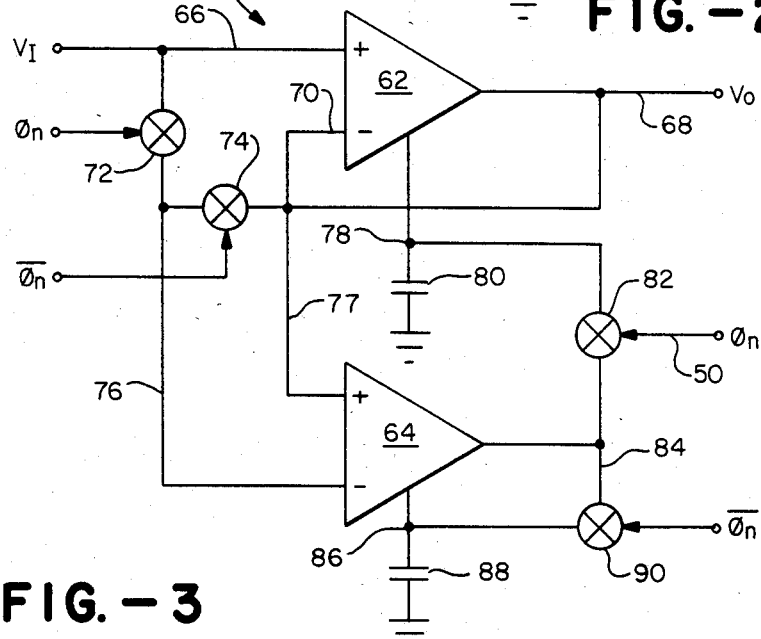
FIG.—3

PRECISELY ADJUSTABLE VOLTAGE CONTROLLED CURRENT MIRROR AMPLIFIER

FIELD OF THE INVENTION

The present invention generally relates to improvements in the design and usage of current mirror amplifiers (CMAs) and, in particular, to an improved current mirror amplifier that is precisely adjustable to a stable balance point and that is further readily adaptable to feedback control.

BACKGROUND OF THE INVENTION

The use and appreciation of the adaptability of current mirror amplifiers generally developed along with the emergence of integrated circuit technology. However, the basic circuit structure of a current mirror amplifier has been known for some time. In brief, a current mirror amplifier is constructed from two transistors. As evidence of the adaptability of current mirror amplifiers, these transistors may be constructed from most any component and process technology including, but not limited to, MOSFETs and vertical bipolar transistors. Of general interest are those constructed using a standard silicon processing technology to provide planar MOSFETs.

To form the current mirror amplifier, the drain electrode of a first transistor $Q_1$ is connected in common to the gate electrode of both transistors $Q_1$, $Q_2$. The source electrodes of the transistors $Q_1$, $Q_2$ are commonly connected to a reference voltage potential rail. The current mirror amplifier is thus formed with the drain electrode of $Q_1$ generally acting as a input while the drain electrode of $Q_2$ effectively acts as an output.

The drain to gate connection of transistor $Q_1$ results in its saturated operation. Thus, the input terminal of the current mirror amplifier will tend to accept whatever level of current is provided. Since both transistors $Q_1$ and $Q_2$ share a common gate bias potential and relative gate to source potential difference, transistor $Q_2$ will tend to accept a similar current level through its drain electrode. If given that the transconductance of transistors $Q_1$ and $Q_2$ are equal, the output of the current mirror amplifier will draw a current level identical to the "reference" current level established at the input of the current mirror amplifier. Perhaps the principle advantage of this mode of operation is that the output current level is relatively independent of the voltage potential at the output, so long as it is generally sufficient to maintain $Q_2$ in saturated operation.

As suggested above, the principal use of the current mirror amplifier is as a simple current sink or source that can be set according to an independent reference current level. There are, however, a large variety of other uses of current mirror amplifiers including their use in analog-to-digital conversion, auto-correction and auto-stabilization circuits. Principle among these other uses, perhaps, is its use as an integral part of a differential gain stage within many general purpose and high performance operational amplifiers.

In all of the foregoing applications, a common problem persists in the use of current mirror amplifiers. Generally stated, the problem is that the transconductance of the transistors $Q_1$, $Q_2$ are matched to only a certain degree. Perhaps more accurately, since current mirror amplifiers may be easily adapted to provide current gain, the problem is a failure to accurately obtain a desired ratio of transconductances for the transistors $Q_1$, $Q_2$. This arises due to the fact that, regardless of the precautions taken, localized variations in the processing of the transistors $Q_1$, $Q_2$, will always obtain with the direct result that their transconductances will variably deviate from their desired values. Although the differences between the desired and the obtained transconductance ratios may be quite small, it is often quite sufficient to negatively impact the accurate operation of a related circuit. For example, the use of the current mirror amplifier as an integral part of an operational amplifier's gain stage results in a substantial amplification of the transconductance difference error at the output of the operational amplifier. Consequently, it is greatly desired that some manner of adjusting the transconductance match ratio of the transistors $Q_1$, $Q_2$ be provided with or as part of the current mirror amplifier.

In providing any such manner of adjusting the transconductance ratio of the transistors $Q_1$, $Q_2$, a number of concerns must be simultaneously addressed. These concerns include providing for the transconductance ratio adjustment without impacting the nominal operation of the current mirror amplifier or its adaptability to be used in any desired application. Further, the adjustment circuit itself should not be so sensitive to its operating conditions as to effectively obviate any improvements obtained through the provision of transconductance ratio adjustability.

Numerous circuit and processing schemes have been proposed and implemented to reduce the effects of the difference between actual and desired transconductance ratios and to provide for the direct adjustment of the transconductance of either or both of the transistors $Q_1$, $Q_2$. Among these schemes are the provision of respective resistors in the source electrode conduction paths of the transistors $Q_1$, $Q_2$. Alternately, resistors may be place between the respective gates electrodes of transistors $Q_1$, $Q_2$ and their interconnection to the drain electrode of $Q_1$. In both cases, the tolerance control over the resistance value of the resistors largely becomes the controlling factor in obtaining the desired transconductance ratio for the current mirror amplifier as a whole. However, the tolerance control over the resistance values may often be insufficient for the design goals of many applications.

Another scheme for providing an effective adjustment to the transconductance ratio is through the use of an additional current balancing network. Such a network is typically external to integrated circuit implementations of current mirror amplifiers and thus immediately evidences the undesirable network component selection and placement aspect of its implementation. Other undesirable aspects of this scheme include manufacturing cost and potential temperature sensitivity, at least to the extent that the thermal response of the external components may be significantly different from that of the current mirror amplifier as implemented as an integrated circuit.

A more recent and comparatively more accurate method of effectively achieving the desired transconductance ratio is through the use of component trimming. In practice, this typically involves the use of a laser to adjust the post-processing resistance value of integrated circuit components that set the current level to the imput of the current mirror amplifier or, most directly, the transconductance of $Q_1$ itself. Though such component trimming can be effectively used to establish the exact transconductance ratio desired, the trimmed resistance values are generally accurate only for a particular temperature. Thus, environmental changes or simply a steady state environment different from that for which the components were trimmed may defeat the effective adjustment of the transconductance ratio.

An even more recent circuit scheme for modifying the transconductance ratio is shown in U.S. Pat. No. 4,068,182, issued to Dingwall, et al. on Jan. 10, 1978. There, an additional FET $Q_3$ is provided to divert a portion of the reference current that would otherwise pass through transistor $Q_1$. The source and drain electrodes of the FET $Q_3$ are coupled to the corresponding respective electrodes of $Q_1$. The gate electrode of the FET $Q_3$ is provided with a bias potential such that the FET operates in its linear region. In this manner, a controlled portion of the reference current, proportional to the gate biasing potential, is not reflected in the relative gate to source voltage potential of transistor $Q_1$. Therefore, the balance, or effective transconductance ratio, of the current mirror amplifier is correspondingly modified. Unfortunately, the input voltage potential and corresponding current level sunk by transistor $Q_1$ may vary in many applications. Since the drain electrode of the balance adjustment FET $Q_3$ is commonly connected to the input of the current mirror amplifier, it too experiences the same drain voltage fluctuations. As the adjustment FET $Q_3$ is operating in its linear region, these drain voltage variations translate into significant changes in its channel conductance. Consequently, the balance point or apparent transconductance ratio of the current mirror amplifier will change with each and every fluctuation in the drain voltage potential of the adjustment FET $Q_3$.

SUMMARY OF THE INVENTION

Therefore, a general purpose of the present invention is to provide a current mirror amplifier capable of precise and stable current balance adjustment so as to effectively obtain a desired transconductance ratio while retaining all of the advantages and avoiding all of the disadvantages of the prior art.

This is achieved in the present invention through the provision of an adjustable current mirror circuit responsive to a balance control signal wherein the circuit comprises first means for providing a first current path, the first means including reference means for providing a current level control signal, relative to a reference potential, corresponding to the current level of the first current path, second means for providing a second current path, the second means including current control means for controlling the current level of the second current path, the current control means being responsive to the current level control signal, and third means, provided in series with the reference means in the first current path, for adjusting the current level control signal by effectively modifying the reference potential of the first current path in response to the balance control signal.

Thus an advantage of the present invention is that is provides for the effective adjustment of the transconductance ratio with minimal addition of circuit components and a corresponding minimal impact on nominal current mirror amplifier circuit operation.

Another advantage of the present invention is that the transconductance ratio adjustment may be voltage controlled from a simple, single polarity drive source.

A further advantage of the present invention is that it is readily adapted to circuit applications utilizing feedback control as well as to those requiring current source operation.

Still another advantage of the present invention is that it permits the design selection of the nominal transconductance ratio null balance point and the range of adjustment that can be achieved.

A still further advantage of the present invention is that it may be readily realized in integrated circuit form without resort to any additional fabrication processing.

Yet still another advantage of the present invention is that it realizes high sensitivity, low thermal drift and good saturation recovery during operation.

A yet still further advantage of the present invention is that it is readily adaptable to a wide variety of devices including an optimal, continuously offset-voltage corrected operational amplifier system fully self-contained on an integrated circuit chip.

BRIEF DESCRIPTION OF THE DRAWING

Other attendant advantages of the present invention will become apparent and readily appreciated as the same becomes better understood by reference to the following detailed description of the invention when considered in connection with the accompanying drawing, in which like reference numerals designate like parts throughout the figures thereof and wherein:

FIG. 1 is a circuit schematic of a preferred current mirror amplifier embodiment of the present invention;

FIG. 2 is a circuit schematic of a preferred two stage operational amplifier embodiment of the present invention; and FIG. 3 is a simplified circuit schematic of a preferred optimal, continuously offset-voltage corrected operational amplifier system embodiment of the present invention.

DETAILED DESCRIPTION OF THE INVENTION

A preferred adjustable current mirror amplifier, constructed in accordance with the present invention, is shown in FIG. 1. The current mirror amplifier, generally indicated by the reference numeral 10, includes three transistors 12, 16, 22 indicated as $Q_1$, $Q_2$ and $Q_3$, respectively. These transistors 12, 16, 22 are preferably normally-off, n-channel FETs fabricated using a conventional silicon processing technology. Transistors $Q_1$ and $Q_2$ 12, 16 form the basis of the current mirror amplifier 10 as providing their drain electrodes 14, 18 as the respective input and output connections thereto. It should be understood that the terms input and output are not functionally controlling as will be seen in conjunction with the description of FIG. 2 below.

In the preferred embodiment of FIG. 1, the gate electrodes of transistors $Q_1$ and $Q_2$ are commonly connected at node 20 and further connected, also in common, to drain electrode 14. The third transistor $Q_3$ 22 is provided to allow balance adjustment of the current mirror amplifier 10. As shown, the drain electrode of transistor $Q_3$ is connected to the source electrode of transistor $Q_1$ while the source electrode of transistor $Q_3$ is connected to a reference voltage potential rail 24, typically ground. In this manner, transistors $Q_1$ and $Q_3$ provide a first current conduction path for current generally indicated as $I_1$. The source electrode of transistor $Q_2$ is directly connected to the reference voltage potential of rail 24 thereby providing a second current path specifically for the current generally indicated as $2_2$. Finally, the gate electrode of transistor $Q_3$ is left available to receive a current mirror amplifier balance control signal $V_a$ preferably as a bias voltage potential relative to that of the rail 24.

In operation, a desired level of the current $I_1$ is established through the first current path formed by transistors $Q_1$ and $Q_3$. Due to the common gate 20 to drain 14 connection, transistor $Q_1$ operates in its saturation region. The balance control voltage potential $V_a$ applied to the gate electrode 26 of balance adjust transistor $Q_3$, however, is preferably such that adjust transistor $Q_3$ operates in its linear region. In accordance with the present invention, this permits the adjust transistor $Q_3$ to variably adjust the voltage potential at the source electrode of transistor $Q_1$. That is, the balance control voltage potential $V_a$ directly establishes the effective channel conductance of adjust transistor $Q_3$. Based on the desired current level of current $I_1$, a controllable voltage potential is forced at the drain of adjust transistor $Q_3$ and, therefore, the source electrode of transistor $Q_1$.

The current level of current $I_2$ in the second conduction path formed by transistor $Q_2$ directly corresponds to the level of current $I_1$. Since transistors $Q_1$ and $Q_2$ share a common gate electrode voltage potential, transistor $Q_2$ will tend to accept a corresponding level of current $I_2$. Although this tendency is commonly referred to as current mirroring, the level of current $I_2$ need not be identical to that of $I_1$. The desired transconductance of transistor $Q_2$ can be set by design objective to be some multiple or fraction of that of transistor $Q_1$. Ideally, the level of currents $I_1$ and $I_2$ should reflect the design transconductance ratio. Accepting the transconductance ratio as a constant, an assumption accurate to at least a first approximation, the level of the current $I_2$ is directly established by the common gate electrode voltage potential established by transistor $Q_1$. This relationship holds generally so long as the voltage potential present at the output terminal 18 is sufficient to maintain transistor $Q_2$ in or very close to current saturation.

As stated above, the general purpose of adjust transistor $Q_3$ is to allow control over the voltage potential present at the source electrode of transistor $Q_1$ and, thereof, over the voltage potential difference $V_{gs}$ of transistor $Q_1$. In accordance with the present invention, it is this variable voltage potential difference $V_{gs}$ of transistor $Q_1$ that is applied to the gate electrode of transistor $Q_2$. Since the source electrode of transistor $Q_2$ is referenced to a common voltage potential along with the source electrode of adjust transistor $Q_3$, preferably the reference voltage potential rail 24, the balance control voltage potential $V_a$ can be used to control, in inverse proportion, the voltage potential at the gate electrode 20 of transistor $Q_2$. That is, the saturated current level limit of transistor $Q_1$ is respectively increased or reduced with the increase or reduction in $V_{gs}$ of $Q_1$. As the gate to source potential difference $V_{gs}$ of transistor $Q_2$ is the sum of that of $Q_1$ and the drain to source potential difference $V_{ds}$ of $Q_3$, the level of current $I_2$ will be inversely affected relative to $I_1$ and, thereby, an effective adjustment of the transconductance ratio of transistors $Q_1$ and $Q_2$ is obtained.

A particularly advantageous aspect of the present invention is its stability in certain operating circumstances. In particular, as noted above, the level of current $I_2$ conducted through the second conduction path formed by transistor $Q_2$ is relatively independent of the voltage potential applied at the output terminal 18. Since transistor $Q_2$ is operating in its saturation region, changes in the drain to source voltage potential difference, $V_{ds}$, for a given gate bias potential induce no significant change in the level of current $I_2$. Even if the voltage potential present at the output terminal 18 were to fluctuate sufficiently to let transistor $Q_2$ to slip into its linear operating region, the current level of $I_2$ would decrease only slightly, at least initially, due to the highly non-linear relation of $V_{ds}$ to the current $I_2$ when the transistor $Q_2$ is operating close to its saturation region. Thus, the level of current $I_2$ is quite stable with respect to voltage potential variations at the output terminal 18.

The stability of the first current path through transistors $Q_1$ and $Q_3$ is subject to different considerations. Transistor $Q_1$ is locked into saturated operation due to the common connection of its drain and gate electrodes. Consequently, there will be a nonlinear change (typically, a square-law relationship for MOSFETs) in the current level of $I_1$ for a corresponding change in the voltage potential present at the input terminal 14, particularly for small potential difference changes between the input terminal 14 and reference rail 24 potentials. The nonlinear response of transistor $Q_1$ to variations in the input voltage potential is, in accordance with the present invention, directly and substantially reduced by the presence of transistor $Q_3$ in the first conduction path. As noted above, transistor $Q_3$ is preferably biased to operate in its linear region. Thus, for example, any increase in the input voltage potential tends to produce a small increase in the level of current $I_1$ that, in turn, obtains a current corresponding linear increase in the voltage potential present at the common source-drain electrode connection between transistors $Q_1$ and $Q_3$. As a result, the drain to source electrode voltage potential difference $V_{ds}$ of transistor $Q_1$ changes significantly less than any change in the input voltage potential with a corresponding minimalizing effect on the change in the level of current $I_1$. This collection of circumstances obtained in the present invention may be accurately characterized as providing negative feedback. Thus, the current mirror amplifier 10, in accordance with the present invention, remains quite stable even in the presence of voltage potential changes at its input terminal 14.

The serial placement of the adjustment transistor $Q_3$ in the first current path provides a number of further significant advantages. In particular, the sensitivity of the current mirror amplifier 10 to adjustment is extremely high within the entire linearly resistive adjustment range of transistor $Q_3$, since the $Q_3$ gate bias is preferably actively driven under feedback control. Further, the adjust transistor $Q_3$ is effectively precluded from deep saturation during operation due to the current limiting saturated operation of transistor $Q_1$.

FIG. 2 illustrates a basic operational amplifier 30 embodying the current mirror amplifier 10 in accordance with the present invention. As shown, the input stage of the operation amplifier 30 is constructed from a differential amplifier transistor pair 32, 34 fed, in common, from a current source 42 and the current mirror amplifier transistors 12, 16, 22. Input signals to the differential transistor pair 32, 34 are provided on their respective gate electrodes 36, 38. A balance control voltage potential $V_a$ is periodically transferred to the gate electrode 26 of the adjust transistor 22 by a periodically operated switch transistor 52. The resulting balance control voltage potential $V_a$ is maintained on the gate electrode gate 26 preferably by the presence of a capacitor 54 connected thereto and to the reference voltage potential rail 24. The switch transistor 52 is periodically operated by a clock signal $\phi_n$ on its gate electrode 50, preferably at a sufficient frequency and duty cycle to accurately transfer and maintain the balance control voltage potential $V_a$ across the capacitor 54. In this manner, the switch transistor 52 and capacitor 54 act as a sample and hold circuit for applying the single polarity balance control voltage potential $V_a$ to the gate electrode 26 of the adjust transistor 22.

The output of the first stage of the operational amplifier 30 is preferably taken from the output 18 of the current mirror amplifier 10. The output 18 is connected to the gate electrode 43 of a second stage high gain transistor 44. The drain of the transistor 44 is preferably fed from a second current source 48 while the source electrode of the transistor 44 is connected to the reference voltage potential rail 24. Accordingly, an output voltage potential $V_o$ is provided at the output terminal 46 of the operation amplifier 30, provided from the drain of the second stage transistor 44.

In many applications, such as the operational amplifier 30 shown in FIG. 2, it is desirable that the levels of the currents $I_1$ and $I_2$ of the current mirror amplifier 10 be identical. In accordance with the present invention, this design goal may be readily achieved, principally by the appropriate selection of the relative channel widths and lengths of the respective transistors 12, 16, 22 of the current mirror amplifier 10. The relative transconductance of the respective transistors 12, 16, 22 is established in proportion to their respective channel widths and lengths. In particular, the reference transistor 12 present in the first current path is preferably designed with a transconductance greater than that of the mirror transistor 16 while the transconductance of the adjust transistor 22 is preferably less than or equal to that of the mirror transistor 16. Thus, for large balance control voltage potentials $V_a$, the drain to source resistance of the adjust transistor 22 becomes insignificant. The current balance ratio of $I_1:I_2$ nominally becomes that of the transconductance ratio of the reference transistor 12 to mirror transistor 16. Therefore, as the transconductance of reference transistor 12 is larger than that of mirror transistor 16, the level of current $I_2$ will be proportionally less than that of current $I_1$.

As in the operational amplifier 30, the level of currents $I_1$ and $I_2$, in sum, are generally fixed through their common provision via a current source, here source 42. Reducing the balance control voltage potential $V_a$ applied to the gate electrode 26 of the adjust transistor 22, for example, correspondingly increases its channel resistance and, therefore tends to increase its drain to source voltage potential difference $V_{ds}$. The drain to source voltage potential difference $V_{ds}$ of the reference transistor 12, due to its drain to gate connection, must remain sufficient to support the level of current $I_1$. Thus, there is an increase in the voltage potential at the input 14 corresponding linearly with the increased voltage potential $V_{ds}$ across adjust transistor 22. The gate voltage potential of the reference and mirror transistors, 12, 16, relative to the rail 24 voltage potential, similarly increase with a resulting increase in the level of current $I_2$. In turn, the level of current $I_1$ is reduced, due to the common origin of the currents, with a corresponding decrease in the required voltage potential $V_{ds}$ across reference transistor 12 necessary to support the level of current $I_1$. An equilibrium point is typically reached depending on the total current $I_1$ and $I_2$ available and the relative transconductances of the transistors 12, 14, 22. Thus, by the appropriate selection of the transconductance of the three transistors 12, 16, 22, a current balance ratio $I_1:I_2$ of unity may be readily obtained for desired current levels $I_1$, $I_2$ and nominal null point balance control voltage potential $V_a$.

In operation, the operational amplifier 30 of FIG. 2 responds to changes in the voltage potential applied to the respective input gate electrodes 36, 38. A common mode voltage potential applied to the inputs 36, 38 generally will not perturb the voltage potentials present at the input and output terminals 14, 18 of the current mirror amplifier 10. As an advantageous aspect of the present invention, the level of current $I_1$ in the first conduction path is effectively set by the total current sourced by the source 42, the saturation current level of the reference transistor 12 and channel conductivity of the adjustment transistor 22. The level of current $I_2$ in the second conduction path is effectively set by the gate voltage potential of the reference transistor 12. Thus, there is no induced change in the voltage potential at the output terminal of the current mirror amplifier 10 or output voltage potential $V_o$ at the output 46 of the second stage gain transistor 44 due to a common change in the channel conductivities of the input transistors 32, 34 as caused by the common mode input.

However, a perturbation resulting in a potential difference between the inputs 36, 38 of the operational amplifier 30 that, for example, increases the voltage potential of the positive electrode 38 relative to the negative electrode 36 will result in a change in the output voltage potential $V_o$. In such a case, the effective resistance of differential transistor 34 is increased relative to that of differential transistor 32 resulting in a corresponding decrease at the voltage potential of the output terminal 18 relative to that of the input terminal 24. That is, since the drain electrodes of the input transistors 32, 34 are commonly connected and the levels of currents $I_1$ and $I_2$ are effectively fixed, the imposed difference in the input transistor channel conductivities results in a relatively greater voltage potential difference $V_{ds}$ across input transistor 34. As noted above, the voltage potential at the output 18 is permitted to vary relatively independent of the level of current $I_2$ due to the saturated operation of mirror transistor 16. Consequently, the voltage potential change at the output terminal 18 is inverted and amplified by the second stage transistor 44 resulting in a large yet proportional change in the output voltage potential $V_o$.

The current levels of the currents $I_1$ and $I_2$, even in practical applications, tend strongly not to change. In the present invention, the presence of adjustment transistor 22 advantageously does not significantly contribute to any variation in the voltage potential present at the input terminal 14. Thus, the operational amplifier 30 illustrated in FIG. 2 exhibits a high degree of stability while permitting the precise adjustment of the current balance in the twin conductive paths of the input stage.

Considering now FIG. 3, a complete, continuously operating automatic nulling operational amplifier circuit system 60 is shown. The system 60 makes use of two operational amplifiers 62, 64 that are preferably substantially identical to the operational amplifier 30 shown in FIG. 2. The main operational amplifier 62 receives an input signal $V_i$ on its positive input line 66 while providing an output signal on line 68. A second, negative input line 70 of the main operational amplifier 62 is coupled for negative feedback to the output line 68. To this extent, the main operational amplifier 62 functions as a standard unity gain voltage follower.

The second or auxiliary operational amplifier 64 is coupled by its positive input line 77 to the output line 68 of the main operational amplifier 62 while the negative input line of the auxiliary operational amplifier 64 is coupled in common to two switches 72, 74. The first switch 72 is preferably further coupled to the input line 66 of the main operational amplifier 62 so as to permit the gating of the input signal $V_i$ to the negative input line 76 of the auxiliary operational amplifier 64 in response to a clock signal $\phi_n$ of a predetermined frequency and duty cycle. The second switch 74 is further coupled to the positive input line of the auxiliary operational amplifier 64 to permit periodic shorting together of the input lines 76, 77 in response to the complementary clock signal $\phi_n''$ The output line 84 of the auxiliary operational amplifier 64 is periodically coupled through another switch 90 to the gate electrode 86 of the current mirror amplifier adjust transistor within the auxiliary operational amplifier 64. Since the switch 90 is preferably operated in response to the complementary clock signal $\phi_n$, corresponding to the operation of the auxiliary operational amplifier 64 when its input lines 76, 77 are shorted together by switch 74, the voltage potential provided on the output line 84 is applied to the adjust transistor gate electrode 86 as maintained by the capacitor 88 during the cycle portions of $d_n$ that switch 90 is open.

The output line 84 of the auxiliary operational amplifier 64 is further coupled via the switch 82 to the current mirror amplifier ajust transistor gate electrode 78 of the main operational amplifier 62. Consequently, during those portions of the clock cycles $\phi_n$ where switches 72 and 82 are open and switches 74 and 90 are closed, the auxiliary operational amplifier 64 is connected in a self-trimming configuration, independent of main operational amplifier 62. During these clock cycle portions, the auxiliary operational amplifier 64 drives an output voltage potential onto output line 84 to the adjust transistor gate electrode 86 and across capacitor 88 with a negative loop gain to achieve the singular result of obtaining a current mirror amplifier unity current balance.

During the alternate portions of the clock cycle, where switches 72 and 82 are closed and switches 74 and 90 and open, the inverse of the voltage potential difference between the input lines 66, 70 of the main operational amplifier 62 is applied to the input lines 77, 76 of the auxiliary operational amplifier 64. Consequently the output voltage potential on the output line 84 of the auxiliary operational amplifier 64 differs by the current balance error of the current mirror amplifier of the main operational amplifier 62 symmetrical about the output voltage potential that should be on the output line 68. Application of this error voltage potential to the adjust transistor gate electrode 78 trims the current balance of the current mirror amplifier of the main operational amplifier 62 by an appropriate amount to trim the output voltage $V_o$ to its null offset error value. Consequently, the main operational amplifier 62 is permitted to operate continuously while being periodically trimmed to a balanced condition by the operation of the auxiliary operational amplifier 64.

Although shown and discussed as applied to a voltage follower circuit, the operational amplifier system 60 of FIG. 3 generally operates irrespecitve of the particular feedback network associated with the main operational amplifier 62. This capability is recognized by noting that both operational amplifiers 62, 64 receive the same inputs, though inverted with respect to one another, whenever switches 72 and 82 are closed and switches 74 and 90 are open. Thus, any feedback compensation circuit will function equally for both operational amplifiers 62, 64.

EXAMPLE

A unity current level ratio current mirror amplifier has been constructed in accordance with the present invention as shown in FIG. 1. The normally off transistors $Q_1$, $Q_2$, $Q_3$ were fabricated using a conventional silicon n-channel MOSFET processing technology. Transistor $Q_1$ was fabricated to have a channel 20 micrometers in width and 10 micrometers in length, while transistor $Q_2$ was fabricated to have channel 10 micrometers in width and 20 micrometers in length, and transistor $Q_3$ was fabricated to have a channel 10 micrometers in width and 30 micrometers in length. The input and output terminals 14, 18 were coupled through respective transistors of a normally-off, p-channel MOSFET differential pair to a common current source supplying 12.5 microamperes of total current thereto. A balance control voltage potential $V_a$ of approximately 2 volts was found to nominally achieve the desired unity current balance ratio.

Thus, an improved current mirror amplifier that is precisely adjustable to a balance point that is stable throughout the operation of the circuit in which it is employed has been described.

Various modifications and variations of the present invention are contemplated and may be readily resorted to by those skilled in the art in light of the above teachings. There changes may include, but are not limited to, substitution of bipolar transistors for the FETs of the current mirror amplifier, substituting p-channel FETs and operating the current mirror amplifier in a current source mode, placing the adjust transistor in the second current path or symetrically providing adjust transistors in the first and second current paths of the current mirror amplifier to allow flexibility in establishing the relative and absolute levels of the currents $I_1$, $I_2$, and implementing the present invention, in varying degrees, as an integrated or discrete component circuit. It is therefore to be understood that, within the scope of the appended claims, the present invention may be practiced otherwise than as specifically described.

I claim:

1. An adjustable current mirror circuit operating from a reference voltage level and responsive to a balance control signal comprising:
   (a) first means for providing a first current path, said first means including current reference means for providing a current level control signal corresponding to the current level of said first current path with respect to a bias voltage level offset from said reference voltage level;
   (b) second means for providing a second current path, said second means including current control means for controlling the current level of current through said second current path, said current control means being responsive to said current level control signal with respect to said reference voltage level; and
   (c) third means, provided in series with said current reference means in said first current path, for adjusting said current level control signal by providing said bias voltage level variably in response to said balance control signal.

2. The circuit of claim 1 wherein said current reference means, said current control means and said third means each comprise transistors.

3. The circuit of claim 2 wherein said transistor of said current reference means has a transconductance greater than that of said transistor of said current control means and said transistor of said third means has a transconductance less than or equal that of said transistor or said current control means.

4. The circuit of claim 2 or 3 wherein said third means is further characterized in that said transistor of said third means is biased so as to nominally operate in its linear region.

5. The circuit of claim 4 wherein the respective transistors of said current reference means and said current control means are biased so as to nominally operate in their respective saturation regions.

6. An adjustable balance current mirror amplifier responsive to a balance adjustment signal comprising:
(a) first and second transistors each having first, second and control electrodes, the control electrodes of said first and second transistors being coupled in common to the first electrode of said first transistor; and
(b) a third transistor, having first, second and control electrodes, coupled in series with said first transistor, the first electrode of said third transistor being coupled to the second electrode of said first transistor, the control electrode of said third transistor being adapted to receive said balance adjustment signal.

7. The amplifier of claim 6 wherein the series coupling of said first and third transistors is such that the first electrode of said third transistor is coupled to the second electrode of said first transistor.

8. The amplifier of claim 7 further comprising ground reference means coupled to said second electrodes of said second and said third transistors.

9. The amplifier of claim 8 further characterized as having a designed ratio of current through said first and third transistors relative to that through said second transistor corresponding to current balanced operation and wherein the effective transconductance of said first and third transistors is adjustable by said balance adjustment signal, relative to the transconductance of said second transistor, to correspond to said designed current ratio.

10. The amplifier of claim 9 further characterized in that said first and said second transistors nominally operate current saturated, said amplifier further comprising means for biasing said third transistor such that it nominally operates linearly resistive as to current passing between its first and second electrodes variably in proportion to said balance control signal.

11. The amplifier of claim 10 further characterized in that said designed ratio is unity and wherein the transconductance of said first transistor is greater than that of said second transistor and the transconductance of said third transistor is less than or equal that of said second transistor.

12. The amplifier of claim 10 further characterized in that said balance conntrol signal is a bias voltage potential and wherein said third transistor comprises a FET.

13. An operational amplifier stage utilizing an adjustable balance current mirror amplifier responsive to an adjustment voltage comprising:

(a) a differential amplifier having a common current input terminal and a pair of differential voltage output terminals;
(b) a current mirror having a reference current path portion and a mirror current path portion respectively coupled to said pair of differential voltage output terminals for respectively establishing the current level of current flowing therethrough; and
(c) means for serially adjusting the current level of current flowing through said reference current path portion relative to that flowing through said mirror current path portion of said current mirror, said serial adjusting means being responsive to said adjustment voltage said reference path portion of said current mirror serially coupling the corresponding one of said differential voltage output terminals to said serially adjusting means.

14. The stage of claim 13 wherein said adjusting means is further characterized as nominally being variably linearly resistive with respect to current flowing through said reference current path portion of said current mirror.

15. The stage of claim 14 where said current mirror comprises:
(a) first transistor means for sensing the current level of current flowing through said reference current path portion of said current mirror and for providing a current level control signal corresponding thereto; and
(b) second transistor means for controlling the current level of current flowing through said mirror path portion of said current mirror, said second transistor means being responsive to said current level control signal.

16. The stage of claim 15 wherein said adjusting means, said first and said second transistor means comprise respective transistors coupled such that the transistors of said first and adjusting means serially conduct the current flowing through said reference path portion of said current mirror and the transistor of said second transistor means conducts the current flowing through said mirror path portion of said current mirror.

17. The stage of claim 16 wherein the transistor of said first transistor means is coupled so as to be maintained in current saturation and said second transistor means is coupled to said first transistor so as to be nominally maintained in current saturation.

18. The stage of claim 17 wherein the transistor of said first transistor means has a transconductance greater than that of the transistor of said second transistor means and the transistor of said adjusting means has a transconductance less than or equal that of the transistor of said second transistor means.

19. An improved operational amplifier having an amplification stage including a differential amplifier coupled to a current mirror circuit that provides for first and second current conduction paths in support of said differential amplifier, said current mirror circuit operating from a reference voltage level, wherein the improvement comprises:
(a) first means, coupled in series with said first path, for providing a current conduction level control signal proportional to the current conduction level of said first path;
(b) second means, coupled in series with said second path, for controlling the current conduction level of said second path, said second means being coupled to said reference voltage level and responsive to said current conduction level control signal; and (c) third means, coupled in series in said first path between said reference voltage source and said first means, for effectively adjusting said reference voltage level with respect to said first means.

20. The amplifier of claim 19 wherein said current mirror circuit is further characterized as being responsive to a balance adjustment control signal and wherein said third means comprises an active element biased so as to be responsive to said balance adjustment control signal.

21. The amplifier of claim 20 wherein said active element is further characterized as a transistor biased so as to operate in its linear region.

22. The amplifier of claim 21 wherein said first and second means respectively comprise transistors biased so as to operate in their saturated regions.

23. The amplifier of claim 22 wherein said first, second and third means respectively comprise FET transistors.

24. The amplifier of claim 23 further comprising control means for periodically applying said balance adjustment control signal to said third means and means for storing and providing a representation of said balance adjustment control signal in common application to said third means.

25. The amplifier of claim 24 further characterized as having first and second inputs and having an output, wherein said amplifier further comprises routing means, responsive to said control means, for periodically interconnecting said first and second inputs and for routing said output to said third means.

26. The amplifier of claim 25 further comprising a second differential amplifier and a second current mirror circuit, said control and routing means further providing for the periodic application of said balance adjustment control signal to the corresponding third means of said second current mirror.

* * * * *